(12) United States Patent
Ravi et al.

(10) Patent No.: US 10,312,116 B2
(45) Date of Patent: Jun. 4, 2019

(54) METHODS AND APPARATUS FOR RAPIDLY COOLING A SUBSTRATE

(71) Applicant: APPLIED MATERIALS, INC., Santa Clara, CA (US)

(72) Inventors: Jallepally Ravi, San Ramon, CA (US); Steven V. Sansoni, Livermore, CA (US); Kirankumar Savandaiah, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/722,549

(22) Filed: Oct. 2, 2017

(65) Prior Publication Data
US 2018/0025924 A1 Jan. 25, 2018

Related U.S. Application Data

(62) Division of application No. 14/251,134, filed on Apr. 11, 2014, now Pat. No. 9,779,971.

(51) Int. Cl.
H01L 21/67 (2006.01)
(52) U.S. Cl.
CPC .............. H01L 21/67109 (2013.01)
(58) Field of Classification Search
None
See application file for complete search history.

(56) References Cited

U.S. PATENT DOCUMENTS

| 4,615,755 A | 10/1986 | Tracy et al. |
| 6,183,564 B1 | 2/2001 | Reynolds et al. |
| 6,778,762 B1 | 8/2004 | Shareef et al. |
| 7,429,718 B2 | 9/2008 | Inagawa et al. |
| 8,033,771 B1 | 10/2011 | Gage et al. |
| 2003/0159307 A1* | 8/2003 | Sago ............... H01L 21/67017 34/107 |

(Continued)

FOREIGN PATENT DOCUMENTS

JP H06260432 A 9/1994

OTHER PUBLICATIONS

International Search Report and Written Opinion dated Jun. 26, 2015 for PCT Application No. PCT/US2015/020905.

(Continued)

Primary Examiner — Shamim Ahmed
(74) Attorney, Agent, or Firm — Moser Taboada; Alan Taboada

(57) ABSTRACT

Methods and apparatus for changing the temperature of a substrate are provided. In some embodiments, a method includes: placing a substrate onto a support surface of a substrate support disposed within an inner volume of a cooling chamber; moving at least one of the substrate support or a plate disposed in the cooling chamber opposite the substrate support from a first position, in which the substrate is placed onto the support surface, to a second position, in which a second volume is created between the support surface and the plate, the second volume being smaller than and substantially sealed off from a remaining portion of the inner volume; flowing a gas into the second volume to increase a pressure within the second volume; and flowing a coolant through a plurality of channels disposed in at least one of the substrate support or the plate to cool the substrate.

20 Claims, 5 Drawing Sheets

(56) References Cited

U.S. PATENT DOCUMENTS

| | | |
|---|---|---|
| 2005/0229855 A1 | 10/2005 | Raaijmakers |
| 2007/0039942 A1 | 2/2007 | Leung et al. |
| 2007/0137573 A1* | 6/2007 | Kholodenko ..... H01J 37/32091 118/723 E |
| 2008/0017104 A1 | 1/2008 | Matyushkin et al. |
| 2008/0075853 A1* | 3/2008 | Barth .................... C03C 17/347 427/248.1 |
| 2009/0294064 A1* | 12/2009 | Nagayama ........ H01J 37/32623 156/345.39 |
| 2011/0253037 A1 | 10/2011 | Tsunekawa et al. |
| 2012/0093617 A1 | 4/2012 | Kudou et al. |
| 2012/0193071 A1 | 8/2012 | Tsunekawa et al. |
| 2012/0196242 A1 | 8/2012 | Volfovski et al. |
| 2012/0270166 A1 | 10/2012 | Sorabji et al. |
| 2014/0256129 A1 | 9/2014 | Lai et al. |

OTHER PUBLICATIONS

Search Report from The State Intellectual Property Office Of The People's Republic Of China received for Chinese Application No. 2015800157547 dated Oct. 26, 2018.

* cited by examiner

METHODS AND APPARATUS FOR RAPIDLY COOLING A SUBSTRATE

CROSS-REFERENCE TO RELATED APPLICATIONS

This application is a divisional of co-pending U.S. Pat. No. 9,779,971, issued on Oct. 3, 2017, which is herein incorporated by reference in its entirety.

FIELD

Embodiments of the present disclosure generally relate to substrate processing equipment.

BACKGROUND

Formation of some devices on substrates requires multiple processes in various chambers. For example, processes such as atomic layer deposition (ALD), physical vapor deposition (PVD), chemical vapor deposition (CVD), etching, etc., may be performed to form or remove layers on a substrate. Many of these processes require the substrate to be heated to a high temperature and, therefore, subsequent cooling of the processed substrate is necessary.

Some processes require a cool down step before further process steps can be performed. The inventors have observed that many conventional cool down stations are operated in a high vacuum environment and, therefore, take a long period of time to cool a substrate. As such, these cooling stations are a bottleneck in a substrate transfer process in which the substrate is moved from one chamber to another.

Therefore, the inventors have provided improved cooling chambers for more rapidly cooling a substrate.

SUMMARY

Embodiments of methods and apparatus for rapidly cooling a substrate are provided herein. In some embodiments, a cooling chamber for cooling a substrate includes a chamber body having an inner volume; a substrate support disposed in the chamber and having a support surface to support a substrate; a plate disposed in the chamber body opposite the substrate support, wherein the substrate support and the plate are movable with respect to each other between a first position and a second position, wherein when in the first position the substrate support and the plate are disposed away from each other such that the support surface is exposed to a first volume within the inner volume, wherein when in the second position the substrate support and the plate are disposed adjacent to each other such that the support surface is exposed to a second volume within the inner volume, and wherein the second volume is smaller than the first volume; a plurality of flow channels disposed in one or more of the plate or the substrate support to flow a coolant; and a gas inlet to provide a gas into the second volume.

In some embodiments, a substrate processing system includes a central vacuum transfer chamber; at least one vacuum processing chamber coupled to the central vacuum transfer to perform a process on a substrate; and at least one cooling chamber coupled to the central vacuum transfer chamber to cool the substrate. The cooling chamber may include a chamber body having an inner volume; a substrate support disposed in the chamber and having a support surface to support a substrate; a plate disposed in the chamber body opposite the substrate support, wherein the substrate support and the plate are movable with respect to each other between a first position and a second position, wherein when in the first position the substrate support and the plate are disposed away from each other such that the support surface is exposed to a first volume within the inner volume, wherein when in the second position the substrate support and the plate are disposed adjacent to each other such that the support surface is exposed to a second volume within the inner volume, and wherein the second volume is smaller than the first volume; a plurality of flow channels disposed in one or more of the plate or the substrate support to flow a coolant; and a gas inlet to provide a gas into the second volume.

In some embodiments a method for cooling a substrate includes placing a substrate onto a support surface of a substrate support disposed within an inner volume of a cooling chamber; moving at least one of the substrate support or a plate disposed in the cooling chamber opposite the substrate support from a first position, in which the substrate is placed onto the support surface, to a second position, in which a second volume is created between the support surface and the plate, the second volume being smaller than and substantially sealed off from a remaining portion of the inner volume; flowing a gas into the second volume to increase a pressure within the second volume; and flowing a coolant through a plurality of channels disposed in at least one of the substrate support or the plate to cool the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
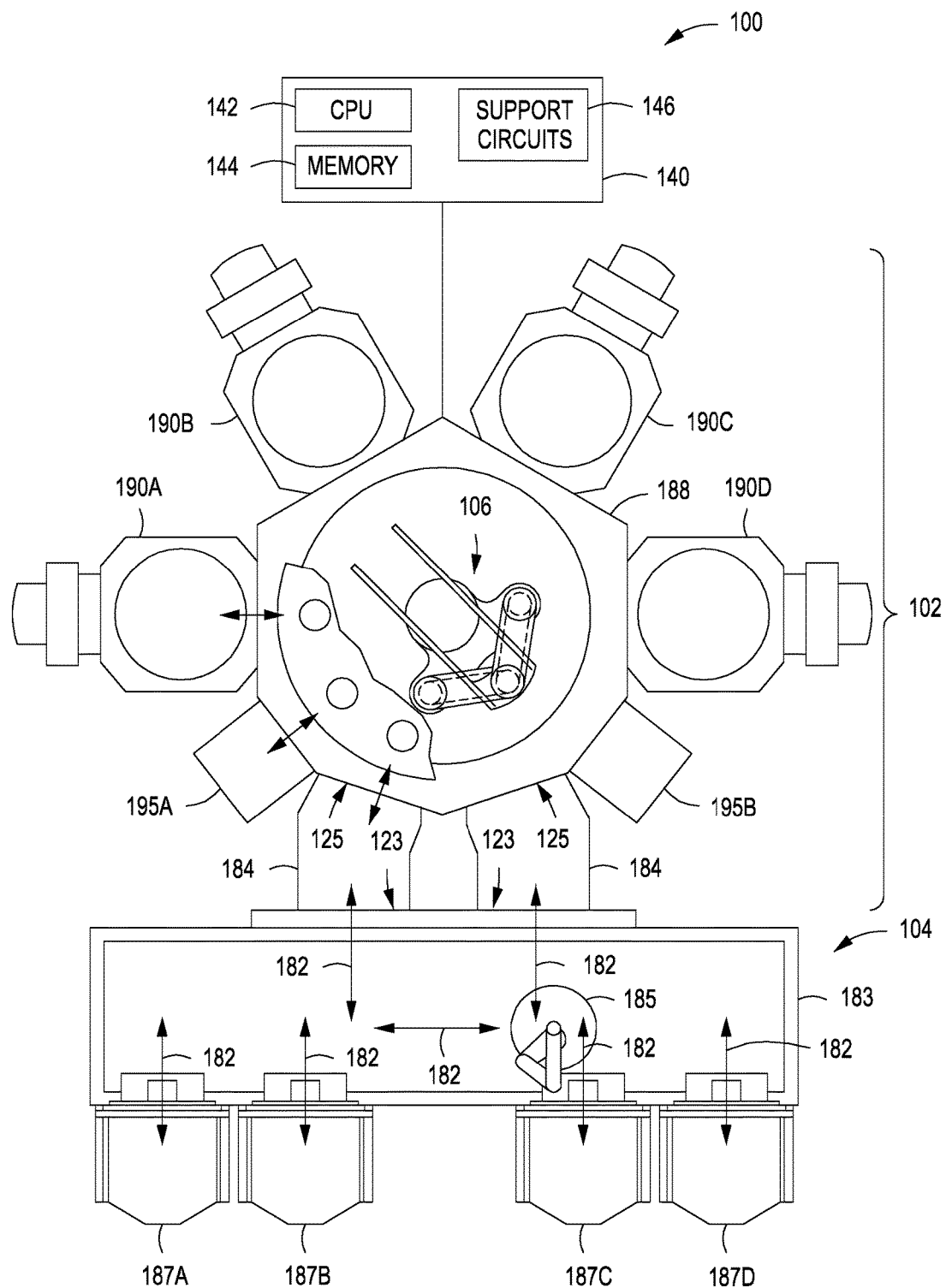
FIG. 1 depicts a processing system suitable for use with the inventive cooling chamber in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods and apparatus for rapidly cooling a substrate are provided herein. Embodiments of the inventive cooling chamber may advantageously increase throughput by decreasing the amount of time necessary to cool a substrate. Embodiments of the inventive processing chamber may advantageously be easily retrofitted to existing processing systems, thereby avoiding unnecessary and costly modification of existing processing systems.

FIG. 1 is a schematic top-view diagram of an exemplary multi-chamber processing system 100 that may be suitable for use with the present inventive cooling chamber disclosed herein. Examples of suitable multi-chamber processing systems that may be suitably modified in accordance with the teachings provided herein include the ENDURA®, CENTURA®, and PRODUCER® processing systems or other suitable processing systems commercially available from Applied Materials, Inc., located in Santa Clara, Calif. Other processing systems (including those from other manufacturers) may be adapted to benefit from the embodiments disclosed in this application.

In some embodiments, the multi-chamber processing system 100 may generally comprise a vacuum-tight processing platform 102, a factory interface 104, and a system controller 140. The processing platform 102 may include a plurality of process chambers 190A-D, at least one cooling chamber 195A-B (two shown in FIG. 1) and at least one load-lock chamber (two shown) 184 that are coupled to a transfer chamber 188. A transfer robot 106 is centrally disposed in the transfer chamber 188 to transfer substrates between the load lock chambers 184, the process chambers 190A-D, and the at least one cooling chamber 195A-B. The process chambers 190A-D may be configured to perform various functions including layer deposition including atomic layer deposition (ALD), chemical vapor deposition (CVD), physical vapor deposition (PVD), etch, pre-clean, de-gas, orientation and center-finding, annealing, and other substrate processes. Each of the process chambers 190A-D may include a slit valve or other selectively sealable opening to selectively fluidly couple the respective inner volumes of the process chambers 190A-D to the inner volume of the transfer chamber 188. Similarly, each load lock chamber 184 may include a port to selectively fluidly couple the respective inner volumes of the load lock chambers 184 to the inner volume of the transfer chamber 188.

The factory interface 104 is coupled to the transfer chamber 188 via the load lock chambers 184. In some embodiments, each of the load lock chambers 184 may include a first port 123 coupled to the factory interface 104 and a second port 125 coupled to the transfer chamber 188. The load lock chambers 184 may be coupled to a pressure control system which pumps down and vents the load lock chambers 184 to facilitate passing the substrate between the vacuum environment of the transfer chamber 188 and the substantially ambient (e.g., atmospheric) environment of the factory interface 104.

In some embodiments, the factory interface 104 comprises at least one docking station 183 and at least one factory interface robot 185 (one shown) to facilitate transfer of substrates from the factory interface 104 to the processing platform 102 for processing through the load lock chambers 184. The docking station 183 is configured to accept one or more (four shown) front opening unified pods (FOUPs) 187A-D. Optionally, one or more metrology stations (not shown) may be coupled to the factory interface 104 to facilitate measurement of the substrate from the FOUPs 187A-D. A substrate treatment apparatus 195 may also be coupled to the factory interface 104 to enable treatment of the substrates before they are moved to the load lock chambers 184. The factory interface robot 185 disposed in the factory interface 104 is capable of linear and rotational movement (arrows 182) to shuttle cassettes of substrates between the load lock chambers 184 and the one or more FOUPs 187A-D. Because current cooling apparatuses are in the same vacuum environment as the rest of the processing platform, the time it takes to cool a substrate is adversely affected. The inventors have designed a cooling chamber, which, although is disposed in the processing platform at vacuum, can cool the substrate in an environment with a pressure higher than vacuum, thereby reducing the time required to cool the substrate.

Figure 2:
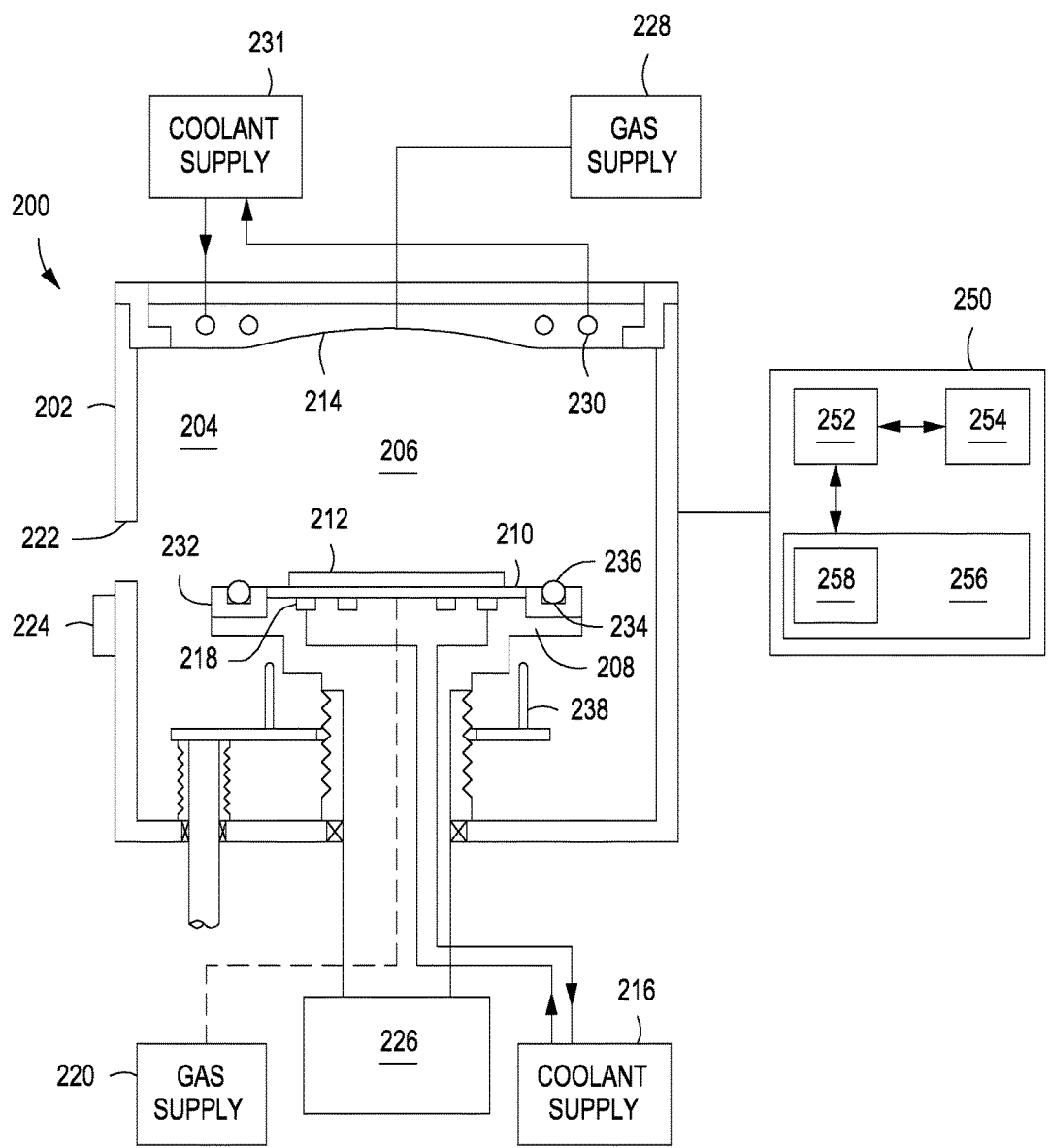
FIG. 2 depicts a cooling chamber in accordance with some embodiments of the present disclosure.

FIG. 2 depicts a cooling chamber 200 according to some embodiments of the present disclosure. The cooling chamber 200 may be used in the multi-chamber processing system 100 described above, or in other multi-chamber processing systems. The cooling chamber 200 generally comprises a chamber body 202 defining an inner volume 204, a substrate support 208 disposed within the inner volume 204, and a plate 214 disposed opposite the substrate support.

Figure 5:
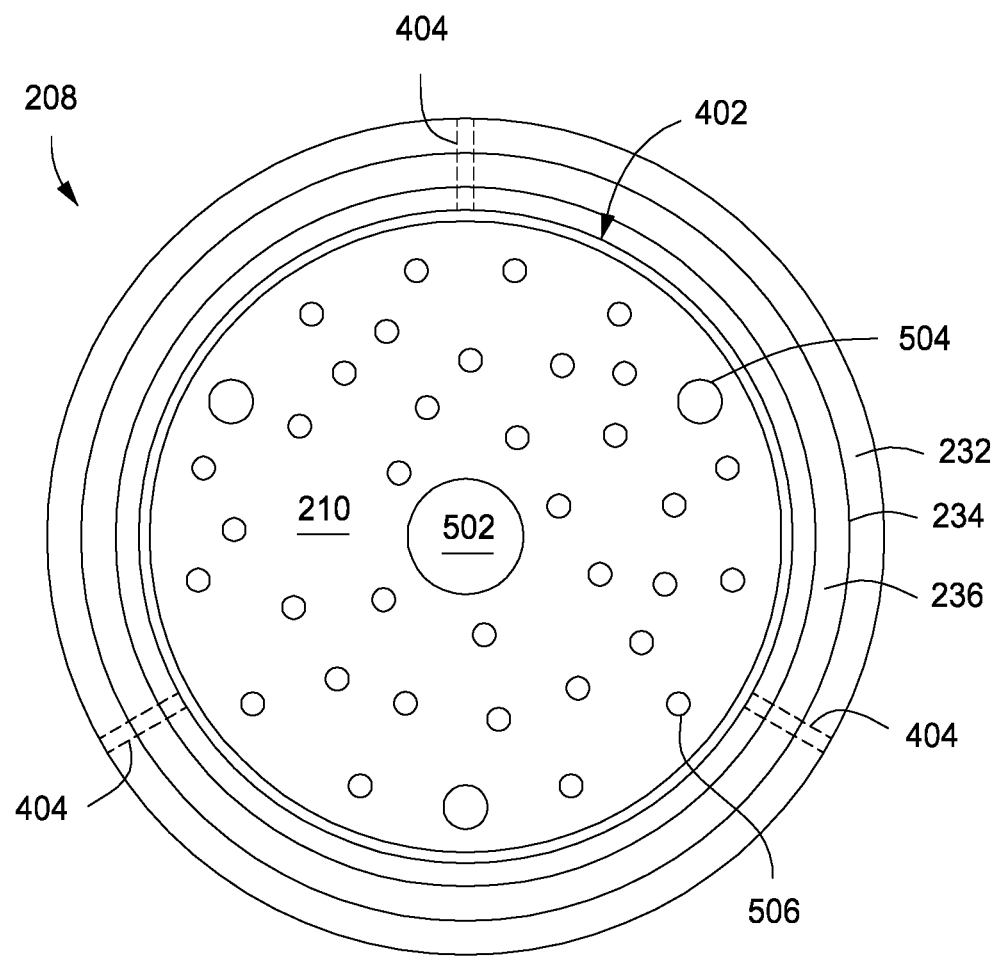
FIG. 5 depicts a top of a substrate support suitable for use with the inventive cooling chamber in accordance with some embodiments of the present disclosure.

The substrate support 208 includes a support surface 210 to support a substrate 212 during cooling. The substrate 212 may rest directly upon the support surface or on other support elements. For example, as depicted in FIG. 5, in some embodiments, a plurality of support elements 506 may be provided to support the substrate 212 in a spaced apart relation to the support surface 210 to minimize potential contamination of the substrate 212 through contact with the substrate support 208. The plurality of support elements 506 may be formed of any material whose properties prevent contamination (e.g., particle generation or undesirable material adhesion to the substrate) of the backside of the substrate 212. For example, in some embodiments, the plurality of support elements 506 are sapphire balls.

The plate 214 is disposed opposite the support surface 210 of the substrate support 208. In some embodiments, the plate 214 may be disposed in or proximate a lid or upper portion of the chamber body 202 (as shown in FIG. 2). The substrate support 208 and the plate 214 are movable with respect to each other between a first position wherein the substrate support 208 and the plate 214 are disposed away from each other (e.g., as shown in FIG. 2) and a second position wherein the substrate support 208 and the plate 214 are disposed adjacent to each other (e.g., as shown in FIG. 3).

In the first position, the support surface 210 of the substrate support 208 is exposed to a first volume 206 within the inner volume 204. The first volume 206 is essentially the entire inner volume 204. For example, the first volume 206 may be predominantly bounded by the plate 214 and inner surfaces of the chamber body 202. In the second position, the support surface 210 is exposed to a second volume (second volume 306 shown in FIG. 3) within the inner volume 204. The second volume 306 is smaller than the first volume 206. For example, the second volume 306 may be predominantly bounded by the plate 214 and the support surface 210 of the substrate support 208. The second volume 306 may be orders of magnitude smaller than the first volume 206. For example, in some embodiments, the second volume 306 may be less than 10 percent, or less than five percent, or about 2 to about 3 percent of the first volume 206. In one non-limiting example, the first volume may be about 9 liters and the second volume may be about 0.25 liters.

Figure 3:
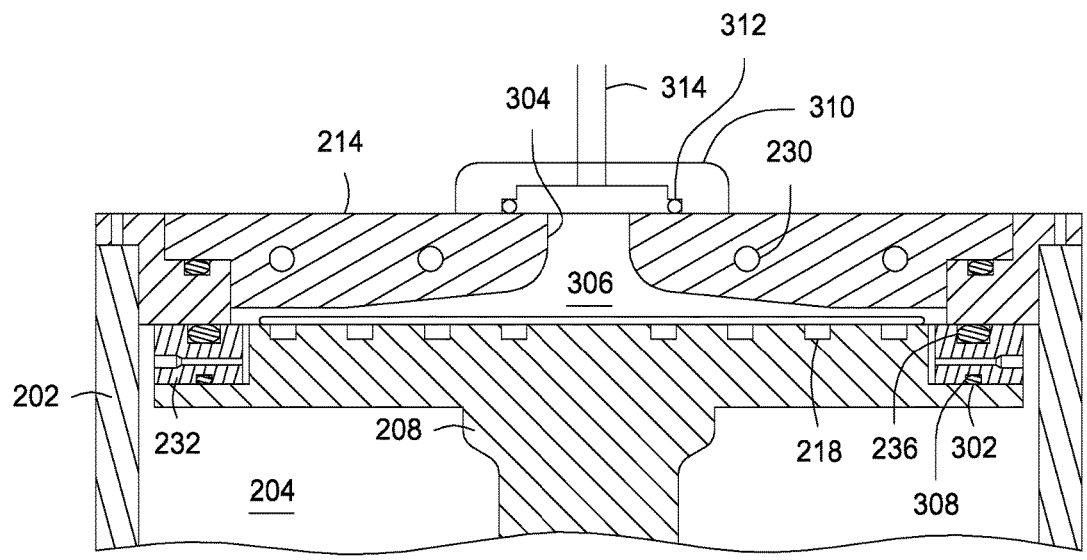
FIG. 3 depicts a partial view of the inventive cooling chamber in accordance with some embodiments of the present disclosure.

In some embodiments, the plate 214 is fixed and the substrate support 208 may be coupled to a lift mechanism 226 to control the position of the substrate support 208 between the first position (e.g., a lower position as shown in FIG. 2) and the second position (e.g., an upper position as shown in FIG. 3). Alternatively or in combination, the plate 214 may be movable with respect to the substrate support 208. In the configuration shown in FIG. 2, the first, or lower position is suitable for transferring substrates into and out of the chamber via an opening 222 disposed in a wall of the chamber body 202. The opening 222 may be selectively sealed via a slit valve 224, or other mechanism for selectively providing access to the interior of the chamber through the opening 222. The second, or upper position is suitable for more rapidly cooling the substrate.

A lift pin assembly 238 including a plurality of lift pins may be provided to raise the substrate 212 off of the support surface 210 to facilitate placement and removal of the substrate 212 onto and off of the substrate support 208. FIG. 5 depicts a top view of a substrate support in accordance with embodiments of the present disclosure. As depicted in FIG. 5, a plurality of lift pin holes 504 are shown extending through the substrate support 208 to facilitate movement of the lift pins of the lift pin assembly 238.

Returning to FIG. 2, the cooling chamber 200 may include one or more mechanisms to enhance the rate of cooling of the substrate 212. In some embodiments, a gas supply 228 may be coupled to the cooling chamber 200 via a gas inlet to provide one or more gases to the inner volume 204. Although only one inlet is shown in FIG. 2, additional or alternative gas inlets may be provided in the plate 214 or in other locations suitable to provide the one or more gases to the second volume 306. Examples of suitable gases for the one or more gases include inert gases, such as argon (Ar), helium (He), nitrogen ($N_2$), or the like, or reducing gases, such as hydrogen ($H_2$) or the like, or combinations of these gases Specifically, the gas supply 228 supplies gas to the second volume 306 when the substrate support 208 and the plate 214 are disposed adjacent to each other. Providing the one or more gases to the second volume advantageously facilitates raising the pressure within the second volume 306, which in turn enhances the rate of heat transfer from the substrate to surrounding components of the cooling chamber 200, such as the substrate support 208 and the plate 214. Moreover, by providing the one or more gases to the second volume 306, which is much smaller than the first volume 206 or the inner volume 204 of the cooling chamber 200, the pressure may be raised without significantly raising the pressure of the coolant chamber 200 as a whole, thereby reducing the time that would be required to pressurize and depressurize the entire coolant chamber or to rely upon a slower rate of cooling of the substrate in the lower pressure environment.

In some embodiments, the gas inlet may be provided through the plate 214 to provide the one or more gases to the second volume 306. For example, as shown in greater detail in FIG. 3, in some embodiments, the gas supply 228 may be coupled to the second volume 306 through a central opening 304 (e.g., a gas inlet) disposed through the plate 214. A cover 310 may be coupled to the plate 214 on a surface opposite the inner volume 204. The cover 310 is coupled to a conduit 314 that leads ultimately to the gas supply 228. A seal or gasket 312 may be disposed between the cover 310 and the plate 214 to minimize or prevent leakage of the one or more gases provided by the gas supply 228 during operation. Other configurations of providing the gas inlet in the plate 214 or other locations may also be used.

Returning to FIG. 2, in some embodiments, an annular seal 236 may be disposed between the substrate support 208 and the plate 214 such that the annular seal 236 contacts the plate 214 when in the substrate support 208 and the plate 214 are in the second position. The annular seal surrounds the support surface 210 of the substrate support 208. The annular seal 236 serves to substantially seal off the second volume defined between the plate 214 and the support surface 210 when the substrate support 208 is in the upper position. Thus, the annular seal 236 facilitates controlling the amount of isolation between the second volume 306 and the remaining portion of the inner volume 204 such that the one or more gases provided to the second volume 306 flow into the remaining portion of the inner volume at a low, controlled rate.

In some embodiments, the annular seal 236 is disposed in the substrate support 208. In some embodiments, the substrate support 208 may include an outer ring 232 surrounding the support surface 210. The outer ring 232 includes an annular groove 234 which retains the annular seal 236. For example, as illustrated in FIG. 3, when the substrate support 208 is in the second position, the annular seal 236 substantially seals the second volume 306 from the remaining portion of the inner volume 204 of the cooling chamber 200.

In some embodiments, a second annular seal 302 may be disposed between the outer ring 232 and the substrate support 205 to ensure that the pressurized one or more gases in the second volume 306 do not flow into the remaining portion of the inner volume 204 from beneath the outer ring 232. For example, the second annular seal 302 may be disposed in a second annular groove 308 in a bottom surface of the outer ring 232. Alternatively, the second annular seal 302 may be disposed partially or completely within a groove formed in the substrate support 208.

Figure 4:
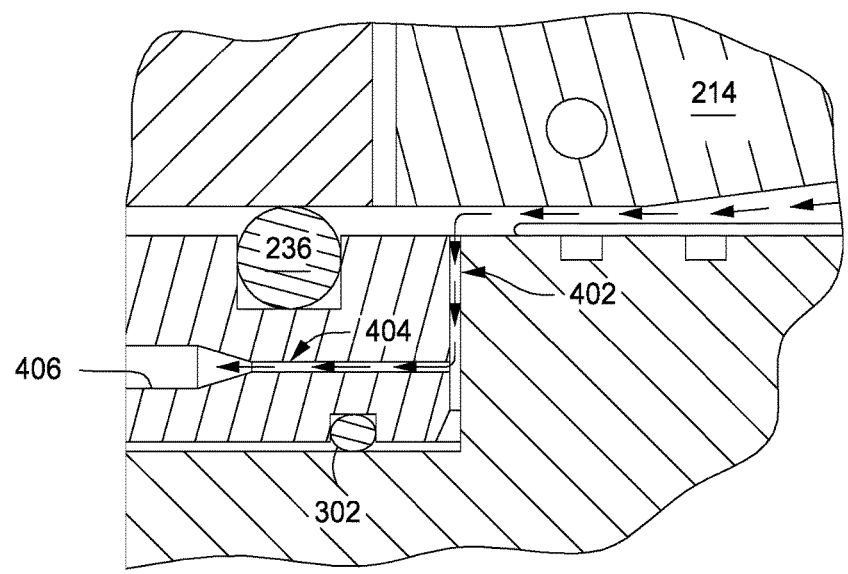
FIG. 4 depicts a partial view of the inventive cooling chamber in accordance with some embodiments of the present disclosure.

FIG. 4 depicts a close-up of area around the outer ring 232 while the substrate support is in the second position shown in FIG. 3 to more clearly show features for controlling the flow of the one or more gases from the second volume 306 into the remaining portion of the inner volume 204. As illustrated in FIG. 4, an annular channel 402 is disposed between the outer ring 232 and the substrate support 208. For example, the annular channel 402 may be defined between an inner diameter of a portion of the outer ring 232 adjacent the support surface 210 and an outer diameter of the support surface 210 of the substrate support 208. The annular channel 402 extends in a direction opposite the plate 214.

At least one through hole 404 may be disposed through the outer ring 232 from a peripheral surface of the outer ring 232 to the annular channel 402. The at least one through hole 404 and the annular channel 402 fluidly couple the second volume 306 to the remaining portion of the inner volume 204. For example, FIG. 5 depicts a top view of a substrate support in accordance with embodiments of the present disclosure. As depicted in FIG. 5, three through holes 404 are shown extending from the annular channel 402 to the peripheral edge of the outer ring 232. Although three through holes 404 are illustrated in FIG. 5, it should be noted that any number of through holes (e.g., one or more) may be provided to control the flow of gas from the second volume 306 to the remaining portion of the inner volume 204.

Returning to FIG. 4, in some embodiments, the annular channel 402 is substantially vertical and the at least one through hole 404 is substantially horizontal (e.g., the annular channel 402 and the at least one through hole 404 may be perpendicular to each other). The at least one through hole 404 may include an outer section 406 with a diameter larger than that of the through hole 404. The arrows depicted in FIG. 4 illustrate a gas flow path according to some embodiments of the present disclosure wherein the inner volume 204 of the coolant chamber is maintained at a first pressure and the second volume 306 is maintained at a second pressure that is greater than the first pressure. As illustrated in FIG. 4, the resultant flow path provides a choked flow of gas from the second volume 306 to the remaining portion of the inner volume 204.

Returning to FIG. 2, in some embodiments, an inner volume facing surface of the plate 214 may be contoured to facilitate providing a smooth, laminar, and more uniform flow of gas within the second volume 306. For example, the surface of the plate 214 facing the second volume may be concave, to form a shallow bowl or funnel that provides a greater thickness across the second volume 306 near a central axis of the substrate support 208 (and the plate 214) and a lesser reducing thickness across the second volume 306 at positions radially outward of the central axis. In some embodiments, a thickness of the plate 214 increases outwardly from the central opening 304 to provide the concave shape of the second volume facing surface of the plate 214.

In some embodiments, at least one of the plate 214 or the substrate support 208 may include one or more flow channels to flow a coolant to increase the rate of cooling of the substrate 212. For example, as shown in FIG. 2, the substrate support 208 may include one or more flow channels 218 disposed in the substrate support 208, for example, beneath the support surface 210. A coolant supply 216 may be coupled to the one or more flow channels 218 to supply a coolant to the flow channels 218. Alternatively or in combination, the plate 214 may include one or more flow channels 230, which may be coupled to the coolant supply 216, or to a second coolant supply 231 (as depicted in FIG. 2).

In some embodiments, a gas supply 220 may be coupled to the substrate support 208 to supply a backside gas through an opening (shown in FIG. 5) in the support surface 210, which may include a plurality of grooves (not shown) to improve the backside gas circulation. Providing a backside gas can further enhance the rate of cooling of the substrate 212 by improving heat conduction between the substrate and the substrate support 208. For example, FIG. 5 depicts a top view of the substrate support in accordance with embodiments of the present disclosure. As illustrated in FIG. 5, the substrate support 208 may include a central opening 502 to flow a backside gas to a region disposed between the support surface 210 and a backside of the substrate 212 when disposed on the substrate support 208. The central opening 502 is in fluid communication with the gas supply 220 to flow a backside gas into a space between the support surface 210 and a backside of the substrate 212 to improve the cooling of the substrate.

Returning to FIG. 2, in some embodiments, a controller 250 may be provided for controlling operation of the cooling chamber 200. The controller 250 may be one of any form of general-purpose computer processor that can be used in an industrial setting for controlling various chambers and sub-processors. The memory, or computer-readable medium, 256 of the CPU 252 may be one or more of readily available memory such as random access memory (RAM), read only memory (ROM), floppy disk, hard disk, or any other form of digital storage, local or remote. The support circuits 254 are coupled to the CPU 252 for supporting the processor in a conventional manner. These circuits include cache, power supplies, clock circuits, input/output circuitry and subsystems, and the like.

The methods disclosed herein may generally be stored in the memory 256 as a software routine 258 that, when executed by the CPU 252, causes the cooling chamber 200 to perform processes of the present disclosure. The software routine 258 may also be stored and/or executed by a second CPU (not shown) that is remotely located from the hardware being controlled by the CPU 252. Some or all of the method of the present disclosure may also be performed in hardware. As such, embodiments of the present disclosure may be implemented in software and executed using a computer system, in hardware as, e.g., an application specific integrated circuit or other type of hardware implementation, or as a combination of software and hardware. The software routine 258 may be executed after the substrate 212 is positioned on the substrate support 208. The software routine 258, when executed by the CPU 252, transforms the general purpose computer into a specific purpose computer (controller) 250 that controls the chamber operation such that the methods disclosed herein are performed.

Figure 6:
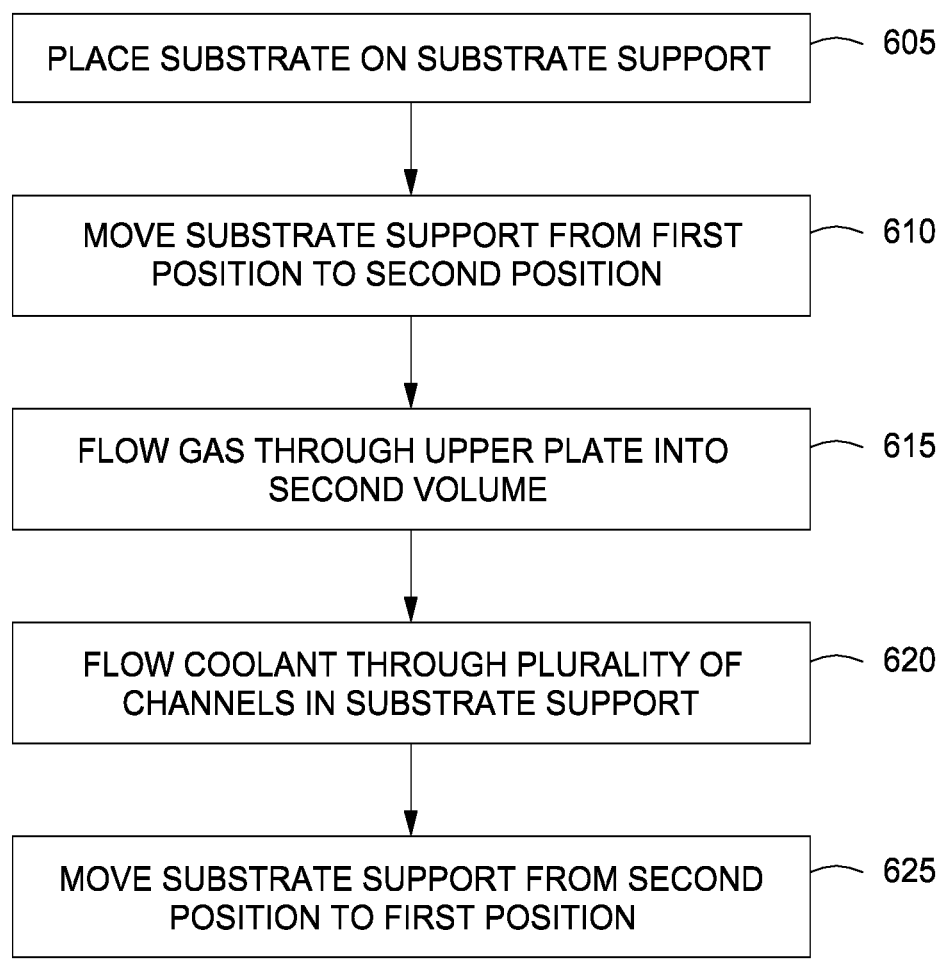
FIG. 6 depicts a flow diagram illustrating a method for cooling a substrate in accordance with some embodiments of the present disclosure.

FIG. 6 depicts a flow diagram illustrating a method 600 in accordance with some embodiments of the present disclosure. The method 600 may be implemented via the controller 250 as discussed above. The method 600 generally begins at 605, where the substrate 212 is placed on the support surface 210 of the substrate support 208. During this process, the lift pin assembly 238 extends through the plurality of lift pin holes 504 to receive the substrate 212 and is subsequently lowered to allow the substrate 212 to rest on the support surface (e.g., directly or on the plurality of support elements).

At 610, the relative position of the substrate support 208 and the plate 214 is moved from a first position (e.g., FIG. 2), which facilitates placement and removal of the substrate 212 onto the substrate support 208, to a second position (e.g., FIGS. 3 and 4), in which the annular seal 236 disposed in the outer ring 232 contacts a periphery of the plate 214 to substantially seal off a second volume 306 from the remaining portion of the inner volume 204 of the cooling chamber 200. In some embodiments, the substrate support 208 is moved and the plate 214 is fixed. In some embodiments, the plate 214 may be moved in addition to or instead of the substrate support 208.

At 615, a gas is flowed from the gas supply 228 through the central opening 304 of the plate 214 and into the second volume 306. The flow of gas into the second volume 306 increases the pressure inside of the second volume 306 to a pressure higher than that of the inner volume 204. The gas then flows from the second volume 306 through the annular channel 402 and through the at least one through hole 404 into the remaining portion of the inner volume 204. In order to more easily maintain the increased pressure inside of the second volume 306 without raising the pressure within the inner volume 204 by too great an amount, the annular channel 402 and the at least one through hole 404 are sized and shaped to create a choked flow. The increased pressure improves the contact area between the substrate 212 and the support surface 210, which results in improved conduction between the substrate 212 and the support surface 210. Moreover, the increased pressure improves conduction through the gas from the substrate to the plate 214, further enhancing the rate of cooling of the substrate.

At 620, coolant may be flowed through the one or more flow channels 218 in the substrate support 208, the one or more flow channels 230 in the plate 214, or both, to more rapidly cool the substrate 212. The coolant may include any known coolant such as, for example, water, such as deionized (DI) water, a suitable perfluoropolyether (PFPE) fluid, such as GALDEN®, or the like.

At 625, the flow of the gas from the gas supply 228 and the gas supply 220 are stopped and the substrate support 208 is moved back to the first position to facilitate removal of the substrate 212 from the substrate support. In this position, the lift pin assembly 238 extends through the plurality of lift pin holes 504 to lift the substrate 212 off of the support surface 210 to facilitate removal of the substrate 212.

Although described above with respect to rapid cooling of a substrate in a chamber coupled to a vacuum processing tool, the apparatus as described herein could instead be used for rapid heating of the substrate by providing a heater or flowing a heat transfer fluid at a desired temperature through the flow channels 218, 230.

While the foregoing is directed to embodiments of the present disclosure, other and further embodiments of the disclosure may be devised without departing from the basic scope thereof.

The invention claimed is:

1. A method for changing the temperature of a substrate, comprising:
   placing a substrate onto a support surface of a substrate support disposed within a first volume of an inner volume of a cooling chamber;
   moving at least one of the substrate support or a plate disposed in the cooling chamber opposite the substrate support from a first position, in which the substrate is placed onto the support surface, to a second position, in which a second volume is created between the support surface and the plate by forming a seal between the substrate support and the plate in a location disposed radially outward of the substrate, the second volume being smaller than and substantially sealed off from a remaining portion of the inner volume;
   flowing a gas into the second volume to increase a pressure within the second volume; and
   flowing a coolant through a plurality of channels disposed in at least one of the substrate support or the plate to cool the substrate.

2. The method of claim 1, further comprising:
   flowing the coolant through the plurality of channels in both of the substrate support and the plate.

3. The method of claim 1, further comprising:
   flowing a backside gas through the substrate support into a space between the substrate and the support surface.

4. The method of claim 1, wherein the substrate support comprises an outer ring surrounding the support surface, and wherein the outer ring comprises an annular channel extending from the support surface in a direction opposite the plate and at least one through hole extending from the at least one first channel to a peripheral surface of the outer ring.

5. The method of claim 4, further comprising:
   flowing the gas from the second volume to the remaining portion of the inner volume through the annular channel and the at least one through hole, wherein the annular channel and the at least one through hole create a choked flow.

6. The method of claim 1, wherein the gas comprises at least one inert gas.

7. The method of claim 1, wherein a thickness of the plate increases along positions radially outward of a central axis of the plate.

8. The method of claim 1, wherein moving at least one of the substrate support or the plate comprises moving the substrate support toward the plate.

9. The method of claim 1, wherein the second volume is substantially sealed off from the remaining portion of the inner volume by providing a choked flow condition between the second volume and the remaining portion of the inner volume such that the pressure inside of the second volume is increased at a greater rate than the pressure within the remaining portion of the inner volume.

10. A method for changing the temperature of a substrate, comprising:
    placing a substrate onto a support surface of a substrate support disposed within a first volume of an inner volume of a chamber;
    moving at least one of the substrate support or a plate disposed in the chamber opposite the substrate support from a first position, in which the substrate is placed onto the support surface, to a second position, in which a second volume is created between the support surface and the plate by forming a seal between the substrate support and the plate in a location disposed radially outward of the substrate, the second volume being smaller than and substantially sealed off from a remaining portion of the inner volume;
    flowing a gas into the second volume to increase a pressure within the second volume; and
    flowing a heat transfer fluid through a plurality of channels disposed in at least one of the substrate support or the plate to change the temperature of the substrate.

11. The method of claim 10, further comprising:
    flowing the heat transfer fluid through the plurality of channels in both of the substrate support and the plate.

12. The method of claim 10, wherein the heat transfer fluid is provided at a desired temperature to heat the substrate.

13. The method of claim 10, further comprising:
    flowing a backside gas through the substrate support into a space between the substrate and the support surface.

14. The method of claim 10, wherein the second volume is substantially sealed off from the remaining portion of the inner volume by providing a choked flow condition between the second volume and the remaining portion of the inner volume such that the pressure inside of the second volume is increased at a greater rate than the pressure within the remaining portion of the inner volume.

15. A method for changing the temperature of a substrate, comprising:
    placing a substrate onto a support surface of a substrate support disposed within a first volume of an inner volume of a chamber;
    moving at least one of the substrate support or a plate disposed in the chamber opposite the substrate support from a first position, in which the substrate is placed onto the support surface, to a second position, in which a second volume is created between the support surface and the plate by forming a seal between the substrate support and the plate in a location disposed radially outward of the substrate, the second volume being smaller than and substantially sealed off from a remaining portion of the inner volume;
    increasing a pressure within the second volume; and
    flowing a heat transfer fluid through a plurality of channels disposed in at least one of the substrate support or the plate to change the temperature of the substrate.

16. The method of claim 15, wherein the heat transfer fluid is provided at a desired temperature to heat the substrate.

17. The method of claim 15, wherein the heat transfer fluid is provided at a desired temperature to cool the substrate.

18. The method of claim 15, further comprising:
flowing the heat transfer fluid through the plurality of channels in both of the substrate support and the plate.

19. The method of claim 15, further comprising:
flowing a backside gas through the substrate support into a space between the substrate and the support surface.

20. The method of claim 15, wherein the second volume is substantially sealed off from the remaining portion of the inner volume by providing a choked flow condition between the second volume and the remaining portion of the inner volume such that the pressure inside of the second volume is increased at a greater rate than the pressure within the remaining portion of the inner volume.

\* \* \* \* \*